(12) United States Patent
Selcuk

(10) Patent No.: US 6,291,864 B1
(45) Date of Patent: *Sep. 18, 2001

(54) GATE STRUCTURE HAVING POLYSILICON LAYER WITH RECESSED SIDE PORTIONS

(75) Inventor: Asim Selcuk, Cupertino, CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/310,177

(22) Filed: May 12, 1999

(51) Int. Cl.[7] ............................. H01L 29/78; H01L 33/00
(52) U.S. Cl. ............................. 257/401; 257/410
(58) Field of Search ...................... 257/401, 410

(56) References Cited

U.S. PATENT DOCUMENTS 5,053,849 * 10/1991 Izawa et al. .
5,641,712    6/1997 Grivna et al. .

OTHER PUBLICATIONS

Huang et al, "A new LDO . . . Inverse T–Gate Structure," IEEE Electron Dev Letters, vol EDL 8, #4, 4/1987, pp. 151–153*

* cited by examiner

Primary Examiner—Stephen D. Meier

(57) ABSTRACT

A device and method for reducing parasitic capacitance between the gate and an adjacent conductive layer. A gate structure is provided having a polysilicon layer with recessed side portions. Sidewalls or spacers partially cover the sides of the polysilicon layer, while the exposed side portions of the polysilicon layer are etched to form the recessed side portions. The area that is etched away to form the recessed side portions accounts for the reduction in intra-level parasitic capacitance between the gate and adjacent conductive layers, such as local interconnect layers, interconnect layers, and contact layers. By removing the area etched away to form the recessed side portions, the separation between the gate and the conductive layer is increased, thereby inhibiting parasitic capacitance which, among other factors, is a function of the distance between two electrical components. Consequently, the present invention provides a simple device and method of reducing the parasitic capacitance of the semiconductor device without sacrificing valuable semiconductor space.

10 Claims, 4 Drawing Sheets

US 6,291,864 B1

GATE STRUCTURE HAVING POLYSILICON LAYER WITH RECESSED SIDE PORTIONS

FIELD OF THE INVENTION

The present invention relates to high density semiconductor devices, and in particular, to a method for forming a gate structure having a polysilicon layer with recessed side portions for reducing parasitic capacitance of the gate.

BACKGROUND OF THE INVENTION

There is a constant push in the semiconductor industry towards reducing the size of semiconductor integrated circuits (ICs), which requires the reduction in semiconductor device geometry and interconnect lines connecting the semiconductor devices. Furthermore, the spacing between interconnect lines and adjacent semiconductor devices must also be reduced to fully achieve smaller ICs. However, as the spacing between interconnect lines and semiconductor devices is reduced to the micron and submicron range, a parasitic intra-level capacitance between the interconnect lines and adjacent devices increases. Consequently, in order to reduce cross-talk between interconnect lines and semiconductor devices and to maximize semiconductor device speed it becomes increasingly important to reduce the parasitic capacitance between interconnect lines and semiconductor devices. In fact, in many cases, the intra-level capacitance of metal interconnect lines has become the limiting factor in determining the speed of many silicon ICs.

One approach to reduce the intra-level capacitance involves increasing the spacing between the interconnect lines and adjacent semiconductor devices. However, this proposed solution is not compatible with the original goal of shrinking the size of semiconductor ICs.

A second approach to reduce the intra-level capacitance involves using a low dielectric constant material between the interconnect lines and adjacent semiconductor devices. A third approach involves depositing a first dielectric layer, etching away the initial dielectric material deposited between the interconnect lines and the semiconductor devices, and refilling the etched away portion with a different low dielectric constant polymer. The second and third proposed solutions produce detrimental side effects and may not sufficiently reduce the intra-level capacitance of the IC. With the use of increasingly small spacing between the interconnect lines and semiconductor devices, the low dielectric constants of many dielectric materials are often not low enough to significantly reduce the parasitic inter-level capacitance. Moreover, the process steps associated with incorporating these dielectrics into a conventional process flow are time consuming, complicated, and expensive. The resulting structure also may reduce the efficiency of heat dissipation since materials having lower dielectric constants generally have lower thermal conductivity. Furthermore, the resulting structure creates other reliability problems that include, but are not limited to, moisture absorption, adhesion failures, and mechanical stress failures.

Thus, there is a need for improved structures that reduce the parasitic capacitance between interconnect lines and adjacent semiconductor devices without the drawbacks described above. Accordingly, a need exists for a device that is structurally sound, is not expensive to manufacture and does not cause a significant increase in the cycle time of the manufacturing process flow. The method should also not impede thermal dissipation and should be compatible with shrinking the size of semiconductor ICs.

SUMMARY OF THE INVENTION

The present invention provides a device and method for reducing parasitic capacitance between the gate and an adjacent conductive layer. The present invention achieves a reduction in intra-level parasitic capacitance by providing a gate structure having a polysilicon layer with recessed side portions.

The present invention advantageously provides an embodiment that includes sidewalls or spacers to partially cover the sides of the polysilicon layer, while the exposed side portions of the polysilicon layer are etched to form the recessed side portions. The area that is etched away to form the recessed side portions accounts for the reduction in intra-level parasitic capacitance between the gate and the adjacent conductive layer. By removing the area etched away to form the recessed side portions, the present invention increases the separation between the gate and any nearby conductive layers, such as local interconnect layers, interconnect layers, and contact layers, thereby inhibiting parasitic capacitance which, among other factors, is a function of the distance between two electrical components. Consequently, the present invention provides a simple device and method of reducing the parasitic capacitance of the semiconductor device without sacrificing valuable semiconductor space.

Additional advantages and other features of the invention will be set forth in part in the description which follows and in part will become apparent to those having ordinary skill in the art upon examination of the following or may be learned from the practice of the invention. The advantages of the invention may be realized and obtained as particularly pointed out in the appended claims.

DETAILED DESCRIPTION OF THE INVENTION

The present invention advantageously provides a device and method for reducing parasitic capacitance between the gate and an adjacent local interconnect. The present invention achieves a reduction in intra-level parasitic capacitance by providing a gate structure having a polysilicon layer with recessed side portions. The recessed side portions increase the separation between the gate and a local interconnect layer to inhibit parasitic capacitance which is a function of the distance between two electrical components.

Figure 1A:
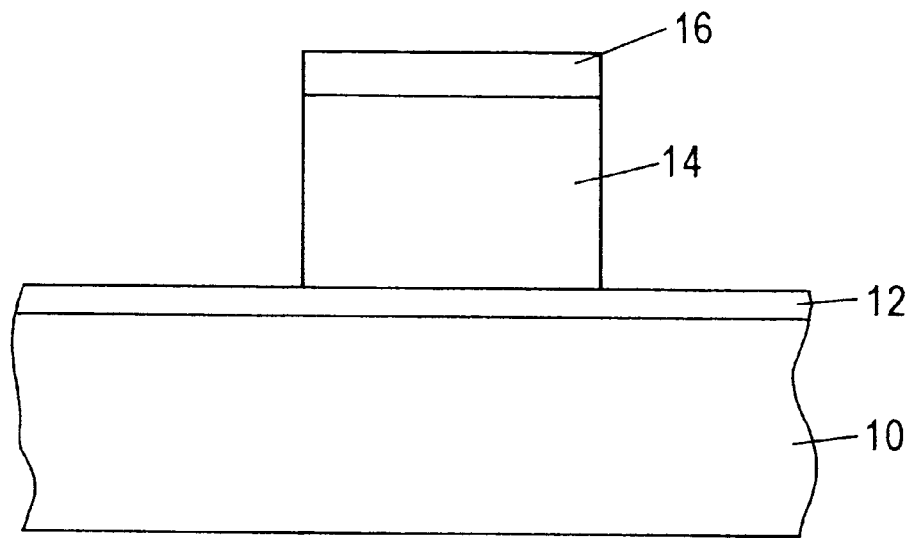
FIG. 1A is a partial, cross-sectional, side view of a semiconductor device according to the present invention depicting a gate stack formed on a silicon substrate.

FIGS. 1A–1D depict a semiconductor device of the present invention at various stages along the manufacturing process. FIG. 1A is a cross-sectional view of a semiconductor substrate 10 made of silicon, for example, upon which a gate stack is fabricated. The gate stack includes a gate oxide layer 12 deposited on a top surface on the substrate 10 and a gate polysilicon layer 14 deposited on a top surface of the gate oxide layer 12. The gate oxide layer 12 is left unetched until later in the process in order to protect the substrate 10 from various subsequent etching processes. The gate stack has a layer 16 deposited on a top surface of the polysilicon layer 14, which will be used in subsequent processing steps. The layer 16 has a thickness large enough to survive a subsequent silicon nitride etch, for example, in a range between about 1000 and 2000 Å, and preferably about 1500 Å. The layer 16 is made of a material that is resistant to silicon nitride etching and polysilicon etching processes, for example the preferred material is oxide. The gate depicted in FIG. 1A has a conventional generally rectangular-shaped profile.

Figure 1B:
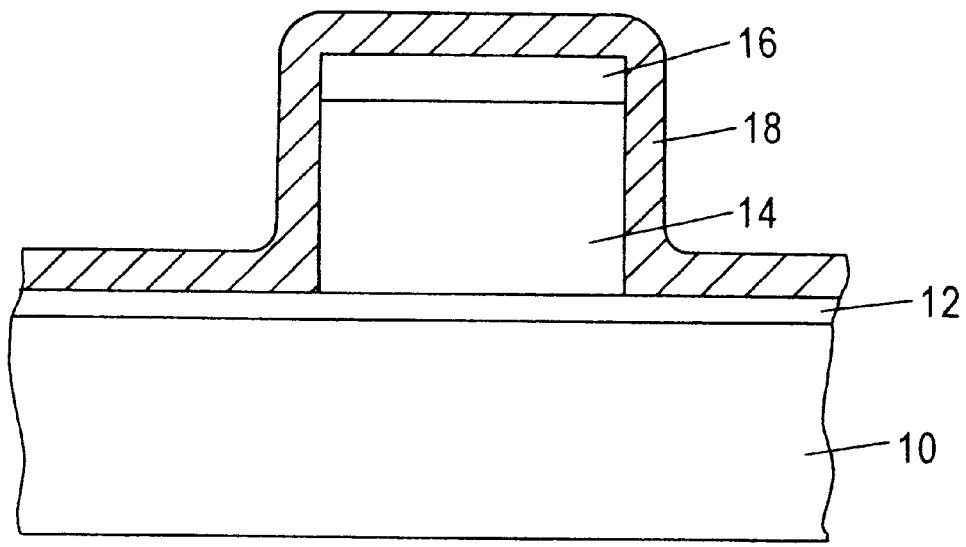
FIG. 1B is a partial, cross-sectional, side view of a semiconductor device according to the present invention depicting a gate having a silicon nitride layer deposited thereon.

FIG. 1B depicts the semiconductor device with a layer 18 deposited on the gate and over the exposed portion of the silicon substrate 10. The layer 18 is made of a material that is resistant to polysilicon etching processes, for example the preferred material is silicon nitride. The layer 18 is formed using any suitable processing method and has a thickness in a range between about 1000 and about 2000 Å, and preferably about 1500 Å.

Figure 1C:
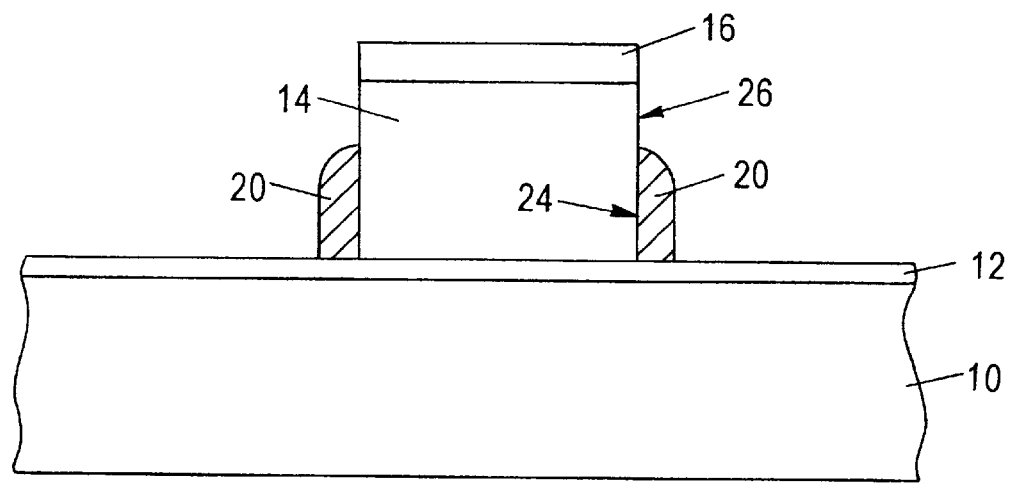
FIG. 1C is a partial, cross-sectional, side view of a semiconductor device according to the present invention depicting the gate having a silicon nitride layer of FIG. 1B etched away to form sidewalls partially covering a polysilicon layer.

As depicted in FIG. 1C, spacers or sidewalls 20 are formed on the sides of the gate by etching the layer 18. Any suitable anisotropic etching method can be used to form the sidewalls 20. The sidewalls 20 are formed such that the sidewalls 20 partially cover the sides of the polysilicon layer 14. The amount of covered side surface of the polysilicon layer 14, or covered side portion 24 and the amount of exposed side surface of the polysilicon layer 14, or exposed side portion 26 can be varied. More specifically, the sidewalls 20 extend upward from the gate oxide 12 to a position on the polysilicon layer 14 such that between about 30 and about 60 percent of the side of the polysilicon layer 14 is covered by the sidewalls 20.

Figure 1D:
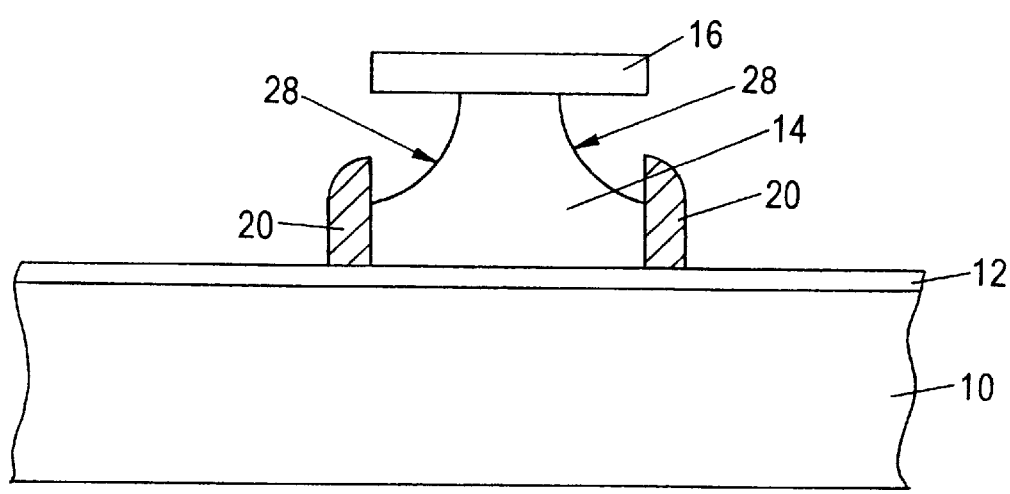
FIG. 1D is a partial, cross-sectional, side view of a semiconductor device according to the present invention depicting the gate having sidewalls of FIG. 1C wherein the polysilicon layer has exposed side portions that are etched away.

FIG. 1D depicts a gate after the exposed side portions 26 of the polysilicon layer 14 have been etched to form recesses 28. Any suitable etching method preferably an isotropic etching, can be used to form the recesses 28. A suitable etching chemistry that preferentially etches the polysilicon gate 14 isotropically, leaving the silicon nitride and the oxide relatively unetched is $SF_6$. As depicted in FIG. 1D the etching process has the tendency to etch away behind part of the covered side portions 24 and underneath part of the layer 16. In the preferred embodiment the covered side portions 24 are typically on the lower sides of the polysilicon layer 14 near where the polysilicon layer 14 and the gate oxide layer 12 join, and consequently the recesses 28 will typically be located on the upper sides of the polysilicon layer 14 near where the polysilicon layer 14 and the layer 16 meet.

Figure 2:
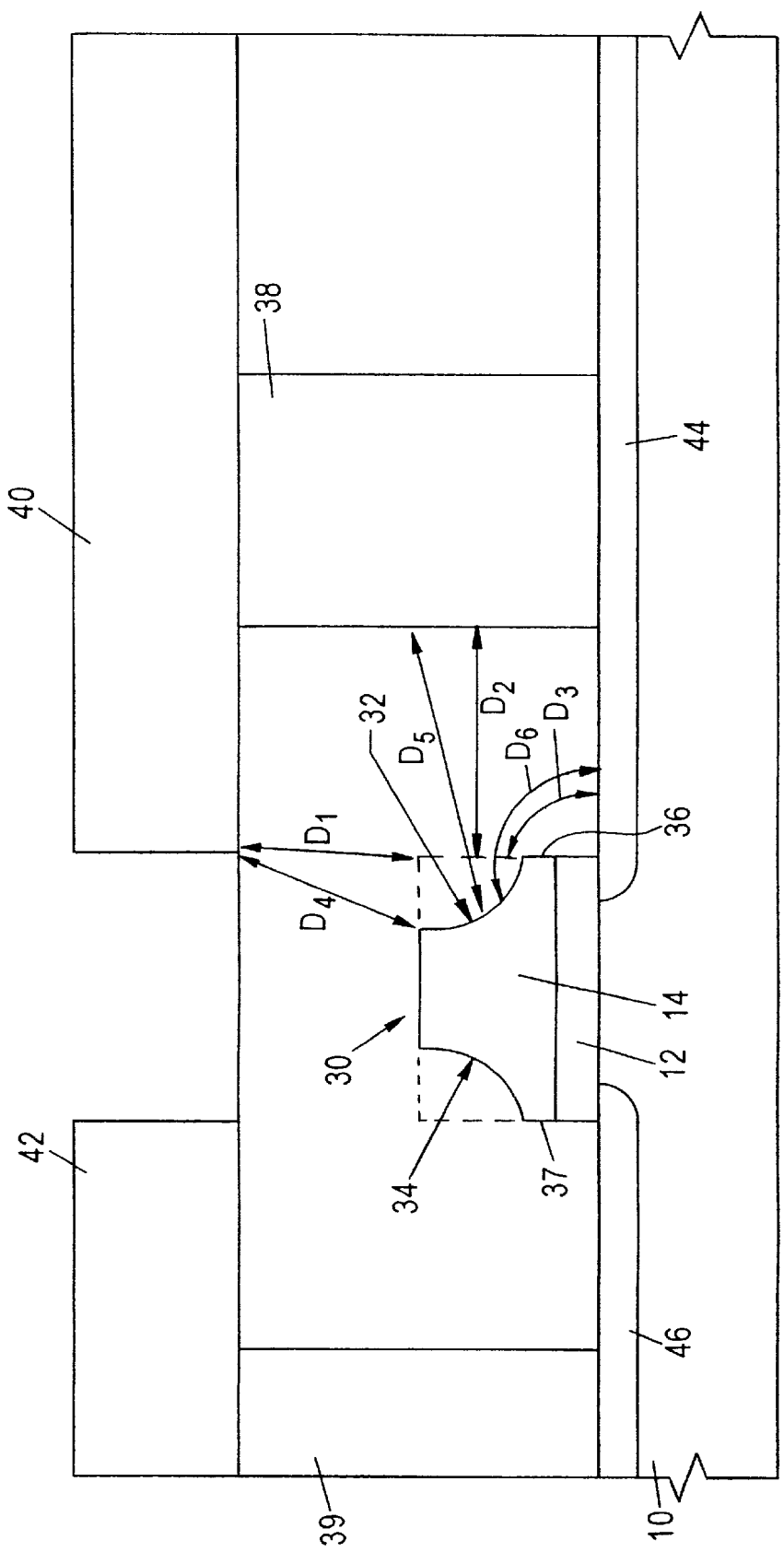
FIG. 2 is a partial, cross-sectional, side view of a semiconductor device according to the present invention depicting a gate having a polysilicon layer with exposed side portions etched away positioned adjacent a local interconnect.

FIG. 2 depicts a gate 30 processed as depicted in FIGS. 1A–1D and having a polysilicon layer 14 with exposed side portions etched away to form recesses 32 and 34, which are identical to recesses 28 depicted in FIG. 1D. The gate 30 is positioned adjacent one or more local interconnect layer(s) or contact layer(s), 38 and 39, and one or more metal interconnect layers 40 and 42. The semiconductor device depicted in FIG. 2 includes a gate oxide layer 12 that has been etched using a conventional process.

The side of the polysilicon layer 14 that is closest to the local interconnect layer 38 and metal interconnect layer 40 includes a recessed portion 32 and a vertical or non-recessed portion 36, and the side of the polysilicon layer 14 that is closest to the local interconnect layer 39 and metal interconnect layer 42 includes a recessed portion 34 and a vertical or non-recessed portion 37. Additionally, the silicon substrate 10 includes source/drain regions, 44 and 46, adjacent non-recessed portions, 36 and 37, respectively. Assuming that the gate depicted in FIG. 2 had a rectangular cross-sectional shape (as depicted using phantom lines), the side portion closest to local interconnect layer 38 is a distance $D_1$ from the metal interconnect layer 40, a distance $D_2$ from the local interconnect layer 38, and a distance $D_3$ from the source/drain region 44. However, the recessed portion 32 of the present invention provides a distance $D_4$ between the recessed portion 32 and the metal interconnect layer 40, a distance $D_5$ between the recessed portion 32 and the local interconnect layer 38, and a distance $D_6$ between the recessed portion 32 and the source/drain region 44. Note that distance $D_4$ is greater than distance $D_1$, distance $D_5$ is greater than distance $D_2$, and distance $D_6$ is greater than distance $D_3$. Similar observations can be made regarding the side portion of the gate 30 closest to local interconnect layer 39. The distances described above are used to illustrative purposes and generally represent effective distances that can be used to give a general approximation of the overall separation between the gate and adjacent conductive layers in order to calculate an approximate capacitance.

The areas that are etched away to form recessed portions 32 and 34 account for the reduction in intra-level parasitic capacitance between the gate 30 and the local interconnect layers, the metal interconnect layers and the source/drain regions. By removing the areas etched away to form recessed portions 32 and 34, the present invention increases the separation between the gate 30 and adjacent interconnect layers and source/drain regions, thereby inhibiting parasitic capacitance which, among other factors, is a function of the distance between two electrical components. The recessed portions 32 and 34 extend inward from the vertical portions 36 and 37, respectively, by between 10 and 40 percent of the total width of the polysilicon layer 14 in the preferred embodiments. Consequently, the present invention provides a simple method of reducing the parasitic capacitance of the semiconductor device without sacrificing valuable semiconductor space.

Figure 3:
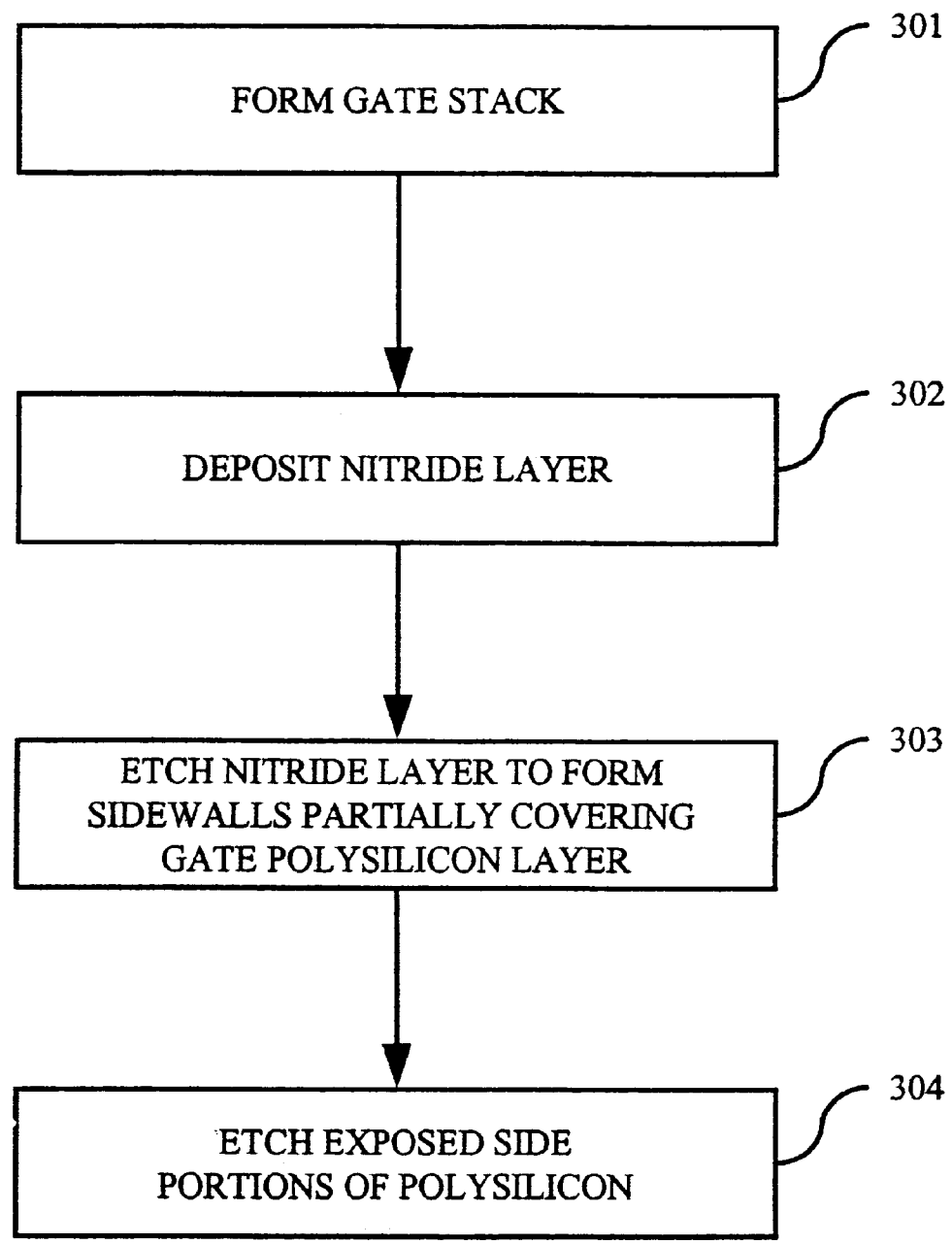
FIG. 3 is a flowchart of a method for producing a gate having a structure that provides reduced intra-level parasitic capacitance according to the present invention.

FIG. 3 depicts a flowchart of a method for reducing parasitic capacitance between a gate and an adjacent local interconnect layer according to the present invention. The method for reducing parasitic capacitance is performed on a gate formed on a substrate and including a gate oxide layer formed on the substrate, and a polysilicon layer formed on the gate oxide layer. Step 301 of the method includes forming a gate stack, which includes a gate having a gate oxide layer and a polysilicon layer with a layer formed thereon made of a material resistant to polysilicon and silicon nitride etching, such as oxide. The gate stack has a generally rectangular profile, which is accomplished by appropriate masking of the gate stack and etching with a suitable etch recipe in an anisotropic fashion so that the oxide layer and the polysilicon layer, are etched with the desired vertical walls. The gate oxide layer is left unetched in order to protect the surface of the silicon substrate during subsequent processing steps.

Step 302 includes depositing a second layer made of a material resistant to polysilicon and oxide etching, such as silicon nitride, on the gate stack and on the silicon substrate. Step 303 includes etching the silicon nitride layer to form spacers or sidewalls partially covering the gate polysilicon layer. More specifically, the sidewalls extend upward from the silicon substrate to a position on the polysilicon layer such that between about 30 and about 60 percent of the side of the polysilicon layer is covered by the sidewalls.

Step 304 includes etching the exposed side portions of the polysilicon layer to form recesses. Any suitable etching method that preferentially and isotropically etches polysilicon and not silicon nitride or oxide is used to form the recesses. The side of the polysilicon layer that is closest to the local interconnect layer includes a recessed portion and a vertical or non-recessed portion. The area that is etched away to form the recessed portion accounts for the reduction in intra-level parasitic capacitance between the gate and the adjacent conductive layers. By removing the area etched away to form the recessed portion, the present invention increases the separation between the gate and adjacent conductive layers, thereby inhibiting parasitic capacitance which, among other factors, is a function of the distance between two electrical components. The area between the gate and the local interconnect layer, including the recessed portions, will be filled in with a dielectric material to provide rigidity to the semiconductor structure and to prevent electrical conduction between the gate and the local interconnect. The recessed portion should extend inward from the vertical portion by between about 10 and about 40 percent of the total width of the polysilicon layer. Consequently, the present invention provides a simple device and method of reducing the parasitic capacitance of the semiconductor device without sacrificing valuable semiconductor space. Once the gate has been formed as described above the semiconductor device can be further processed as desired.

In the previous descriptions, numerous specific details are set forth, such as specific materials, structures, chemicals, processes, etc., in order to provide a thorough understanding of the present invention. However, as one having ordinary skill in the art would recognize, the present invention can be practiced without resorting to the details specifically set forth. In other instances, well known processing structures have not been described in detail in order not to unnecessarily obscure the present invention.

Only the preferred embodiment of the invention and an example of its versatility are shown and described in the present disclosure. It is to be understood that the invention is capable of use in various other combinations and environments and is capable of changes or modifications within the scope of the inventive concept as expressed herein.

What is claimed is:

1. A gate having a structure for reduced parasitic capacitance, said gate comprising:
   a gate oxide layer formed on a silicon substrate; and
   a polysilicon layer formed on the gate oxide layer, said polysilicon layer including:
      a recessed side portion to increase distance between said gate and an adjacent electric structure, and
      a non-recessed side portion adjacent to said recessed side portion, said recessed side portion being located at a distance from an adjacent conductive layer greater than a distance from said non-recessed portion to the adjacent conductive layer;
   wherein said recessed side portion smoothly transitions to said non-recessed side portion.

2. The semiconductor device of claim 1, wherein said recessed portion is located at an upper portion of the polysilicon layer.

3. The semiconductor device of claim 1, wherein said recessed side portion on a side of said polysilicon layer that extends inward from said side of said polysilicon layer by between about 10 and about 40 percent of a total width of said polysilicon layer.

4. The semiconductor device of claim 1, wherein recessed side portion is formed by isotropic etching said polysilicon layer.

5. A gate having a structure for reducing parasitic capacitance of said gate, said gate comprising:
   a gate oxide layer formed on a silicon substrate; and
   a polysilicon layer formed on the gate oxide layer;
   wherein said polysilicon layer includes:
      a profile smoothly transitioning from a narrow portion to a wider portion, said profile configured to increase distance between said narrow portion of said gate and an adjacent conductive layer.

6. The semiconductor device of claim 5, wherein said polysilicon layer has a recessed side portion.

7. The semiconductor device of claim 6, wherein said recessed side portion on a side of said polysilicon layer that extends inward from said side of said polysilicon layer by between about 10 and about 40 percent of a total width of said polysilicon layer.

8. The semiconductor device of claim 6, wherein said recessed portion is located at an upper portion of the polysilicon layer.

9. The semiconductor device of claim 6, wherein said polysilicon layer includes a side having a non-recessed side portion adjacent to said recessed side portion, said recessed side portion being located at a distance from an adjacent conductive layer greater than a distance from said nonrecessed portion to the adjacent conductive layer.

10. The semiconductor device of claim 5, wherein narrrow portion is formed by isotropic etching said polysilicon layer.

* * * * *